(12) United States Patent
Lee et al.

(10) Patent No.: US 7,576,607 B2
(45) Date of Patent: Aug. 18, 2009

(54) MULTI-SEGMENT PRIMARY AND MULTI-TURN SECONDARY TRANSFORMER FOR POWER AMPLIFIER SYSTEMS

(75) Inventors: Chang-Ho Lee, Marietta, GA (US); Ockgoo Lee, Atlanta, GA (US); Jeonghu Han, Atlanta, GA (US); Kyu Hwan An, Dunwoody, GA (US); Hyungwook Kim, Atlanta, GA (US); Dong Ho Lee, Atlanta, GA (US); Ki Seok Yang, Atlanta, GA (US); Haksun Kim, Daejeon (KR); Joy Laskar, Marietta, GA (US)

(73) Assignees: Samsung Electro-Mechanics (KR); Georgia Tech Research Corporation, Atlanta, GA (US)

( * ) Notice: Subject to any disclaimer, the term of this patent is extended or adjusted under 35 U.S.C. 154(b) by 6 days.

(21) Appl. No.: 11/968,862

(22) Filed: Jan. 3, 2008

(65) Prior Publication Data
US 2009/0174477 A1    Jul. 9, 2009

(51) Int. Cl.
*H03F 1/00* (2006.01)
(52) U.S. Cl. .................... 330/195; 330/165
(58) Field of Classification Search .............. 330/195, 330/165
See application file for complete search history.

(56) References Cited

U.S. PATENT DOCUMENTS

| | | | |
|---|---|---|---|
| 2,710,312 A * | 6/1955 | Hafler et al. | 330/122 |
| 4,994,760 A | 2/1991 | Roehrs | |
| 5,091,703 A * | 2/1992 | Schenk | 333/24 R |
| 5,543,773 A | 8/1996 | Evans et al. | |
| 6,577,219 B2 | 6/2003 | Visser | |
| 6,731,166 B1 | 5/2004 | Sabouri et al. | |
| 6,737,916 B2 * | 5/2004 | Luu | 330/10 |
| 6,885,275 B1 | 4/2005 | Chang | |
| 2008/0284553 A1 | 11/2008 | Lim et al. | |

FOREIGN PATENT DOCUMENTS

GB    2445677 A    7/2008

OTHER PUBLICATIONS

Combined Search and Examination Report dated Apr. 30, 2009 for Application No. GB0823679.6.

* cited by examiner

*Primary Examiner*—Henry K Choe
(74) *Attorney, Agent, or Firm*—Sutherland Asbill & Brennan LLP

(57) ABSTRACT

Embodiments of the invention may provide for power amplifier systems and methods. The systems and methods may include a power amplifier that generates a first differential output signal and a second differential output signal, a primary winding comprised of a plurality of primary segments, where a first end of each primary segment is connected to a first common input port and a second end of each primary segment is connected to a second common input port, where the first common input port is operative to receive the first differential output signal, and where the second common input port is operative to receive the second differential output signal, and a single secondary winding inductively coupled to the plurality of primary segments.

23 Claims, 10 Drawing Sheets

MULTI-SEGMENT PRIMARY AND MULTI-TURN SECONDARY TRANSFORMER FOR POWER AMPLIFIER SYSTEMS

FIELD OF INVENTION

Example embodiments of the invention relate generally to power amplifiers, and more particularly, to systems and methods for voltage-boosting transformers to couple one or more power amplifiers to a load.

BACKGROUND OF THE INVENTION

With the explosive growth of the mobile communications industry, many efforts have been made to integrate mobile application functions (e.g., low noise amplifiers, mixers, voltage-controlled oscillators, etc.) into a single semiconductor technology (e.g., a single chip). However, fully integrating a power amplifier on a single chip area presents a variety of difficulties. In particular, bulky power matching structures require a large chip area and if the matching structure is distributed on the whole chip area, then the high output power from the power amplifier can degrade the performance of other mobile application functions. Therefore, in some applications, the matching structure of power amplifiers should be isolated from other mobile application functions into one area and the total matching structure size should be reasonably small to be cost effective while the level of output power is high enough. Accordingly, there is a need for improved power matching designs to implement a fully integrated high-power amplifier system.

BRIEF SUMMARY OF THE INVENTION

According to an example embodiment of the invention, there may be a power amplifier system, which may include a plurality of amplifiers, a single multi-segment primary transformer winding with a first number of $N_1$ turns, and a single secondary transformer winding with a second number of $N_2$ turns. The turns ratio from the primary transformer winding to the secondary transformer winding may be $N_1:N_2$ with $N_2 > N_1$ to boost the voltage of the primary winding to the secondary winding in the ratio of substantially $N_2/N_1$. The multi-segment primary winding may increase the magnetic coupling, therefore minimizing passive loss. Each amplifier may include an input such as differential inputs that are connected to the system input ports at the primary winding, and the primary winding may be coupled to the differential output of the secondary winding. Indeed, the single secondary transformer winding may be inductively coupled to the primary transformer winding and may provide a system output port to which a load may be coupled.

According to another example embodiment of the invention, there may be a power amplifier system. The system may include a power amplifier that may generate a first differential output signal and a second differential output signal, a primary winding comprised of a plurality of primary segments, where a first end of each primary segment may be connected to a first common input port and a second end of each primary segment may be connected to a second common input port, where the first common input port may be operative to receive the first differential output signal, and where the second common input port is operative to receive the second differential output signal, and a single secondary winding that may be inductively coupled to the plurality of primary segments.

According to another example embodiment of the invention, there may be a method for providing a power amplifier system. The method may include providing a power amplifier that generates a first differential output signal and a second differential output signal, receiving the first differential output signal at a first common input port and the second differential output signal at a second common input port, where the first common input port may be connected to a first end of a plurality of primary segments that form a primary winding, and where the second common input port may be connected to a second end of the plurality of primary segments, and inductively coupling the plurality of primary segments to a single secondary winding.

BRIEF DESCRIPTION OF THE DRAWINGS

Figure 1:
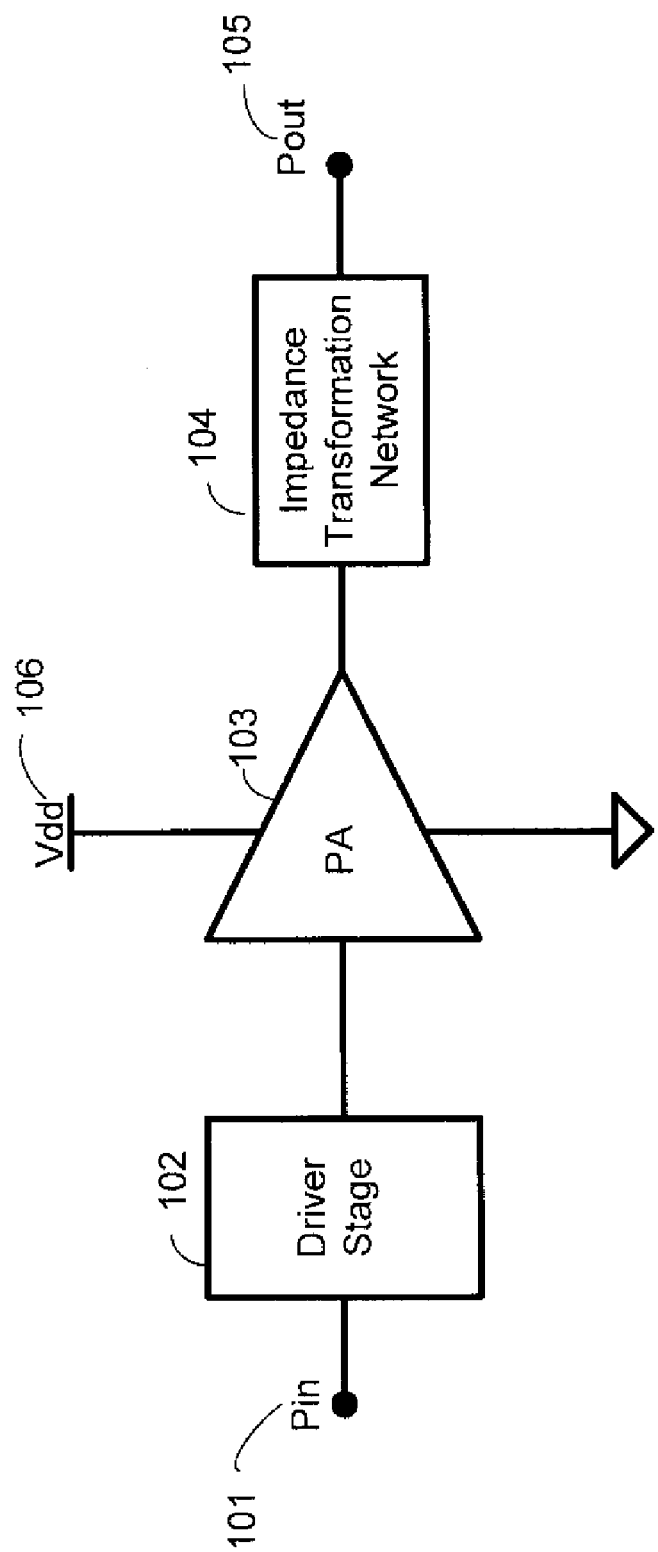

Having thus described the invention in general terms, reference will now be made to the accompanying drawings, which are not necessarily drawn to scale, and wherein:

FIG. 1 is a block diagram for a power amplifier with a driver stage and an impedance transformation network, according to an example embodiment of the invention.

Figure 2:
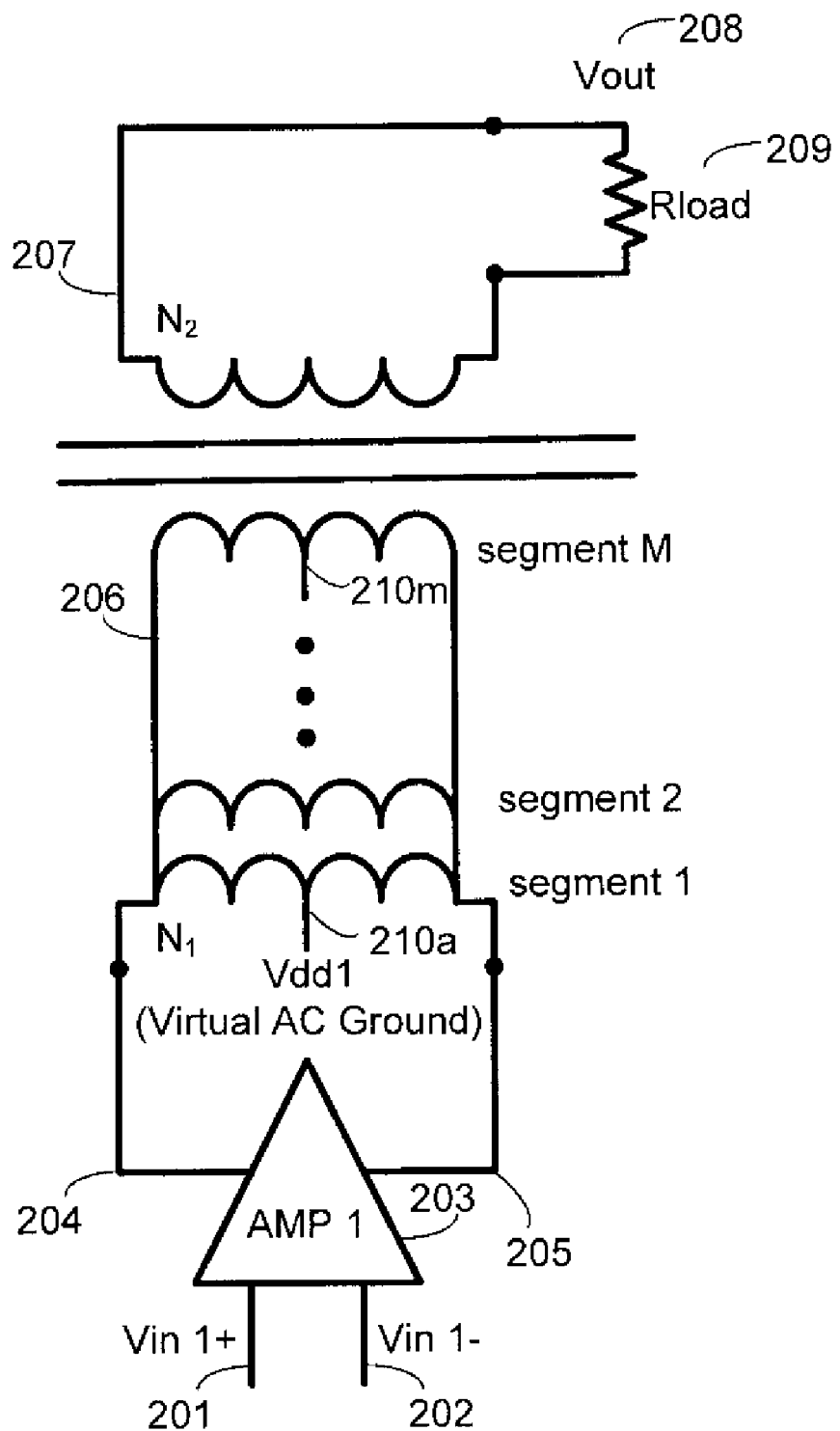

FIG. 2 is an example schematic diagram for a transformer in accordance with an example embodiment of the invention.

Figure 3:
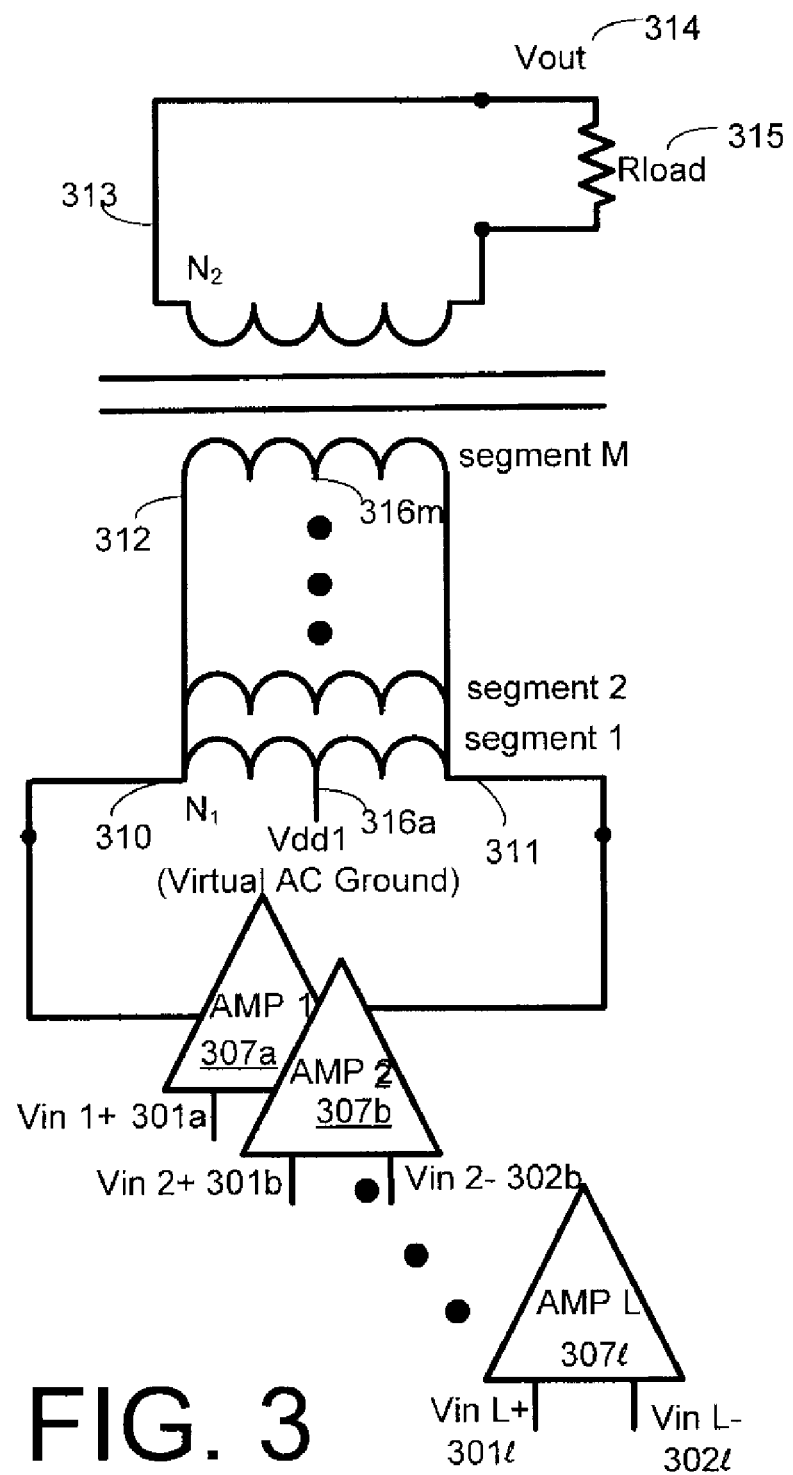

FIG. 3 illustrates an example schematic diagram for a transformer in which the multi-segment primary winding may be connected to a plurality of amplifiers, according to an example embodiment of the invention.

Figure 4:
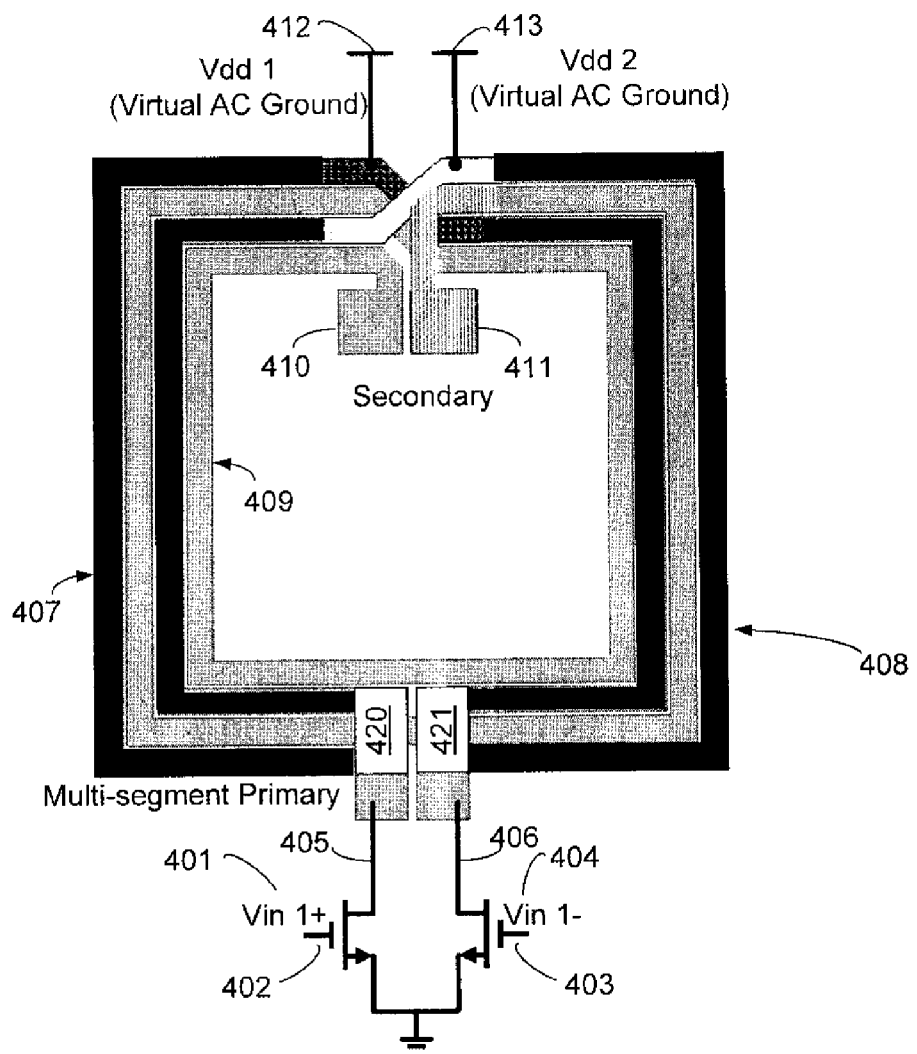

FIG. 4 illustrates an example layout structure of a transformer, according to an example embodiment of the invention.

Figure 5:
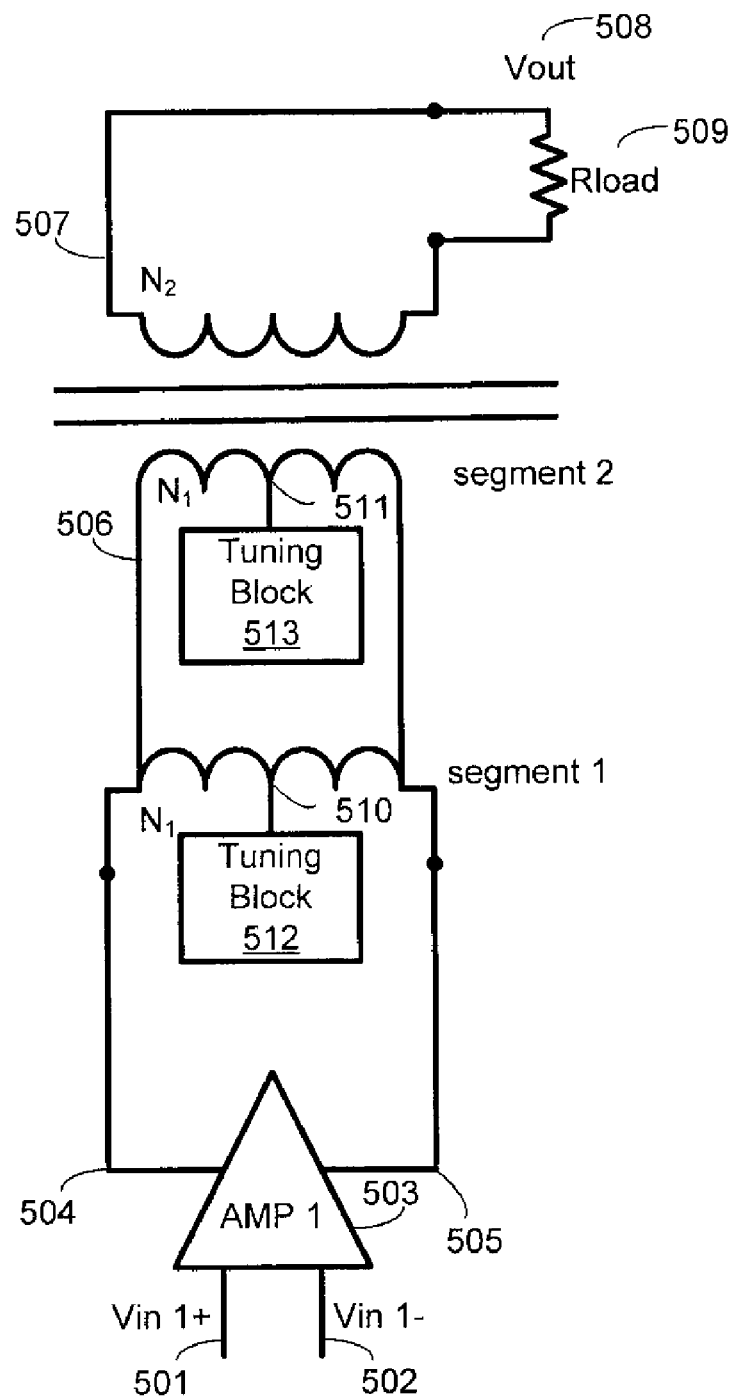

FIG. 5 illustrates an example schematic diagram for a transformer utilizing one or more tuning blocks, according to an example embodiment of the invention.

Figure 6:
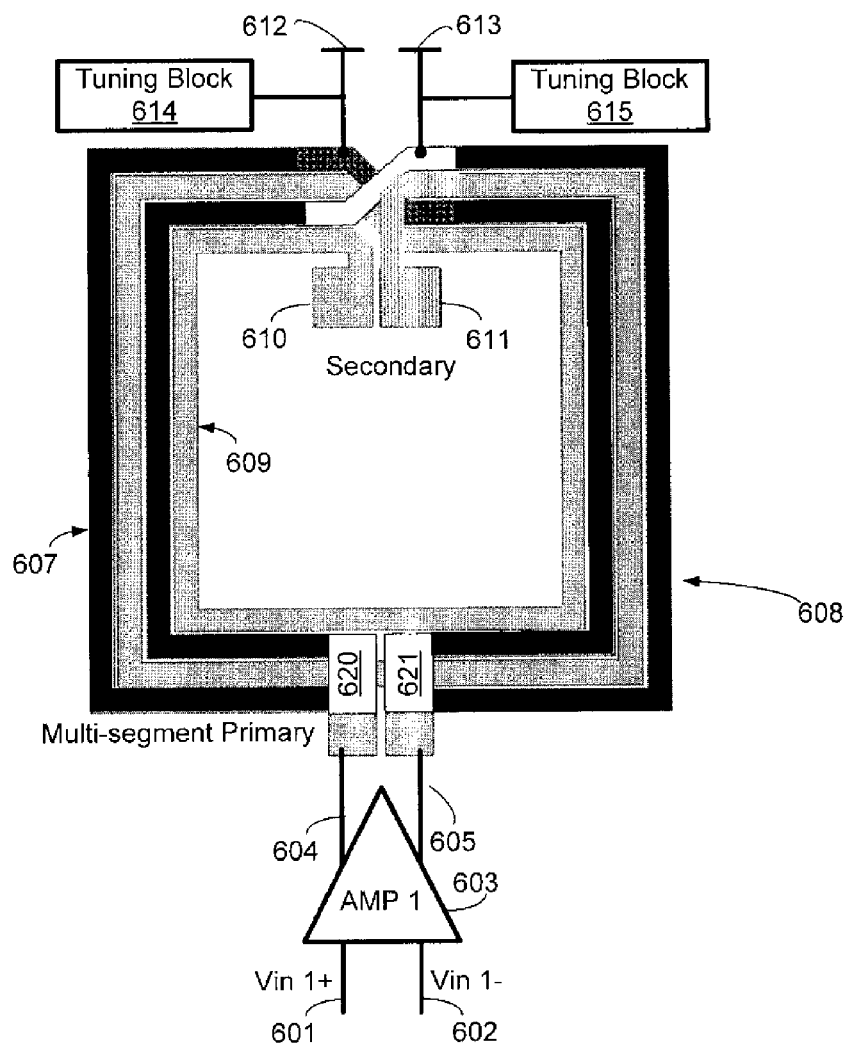

FIG. 6 illustrates an example layout structure for an example transformer utilizing one or more tuning blocks, according to an example embodiment of the invention.

Figure 7:
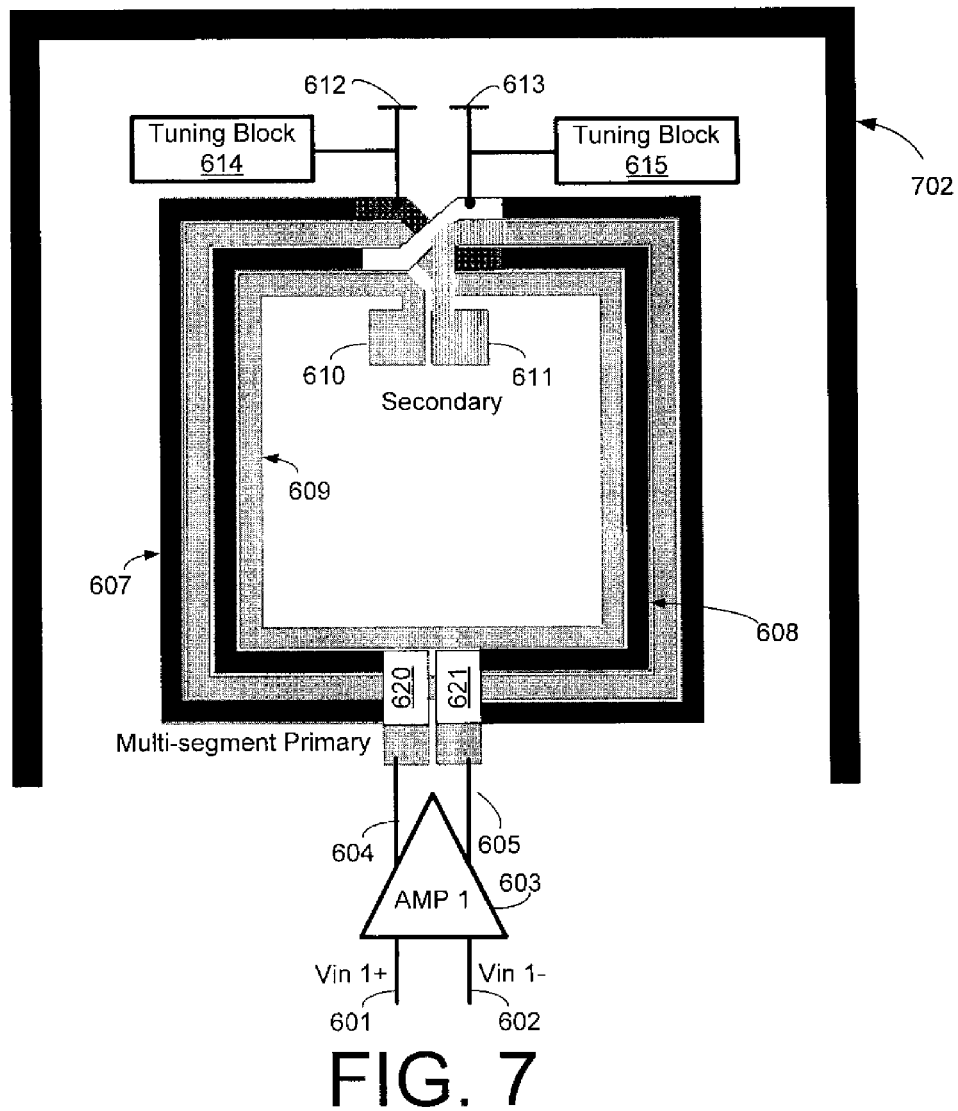

FIG. 7 illustrates an example layout structure of a transformer of an example power amplifier system with an auxiliary winding adjacent to or substantially encapsulating a portion of the transformer, according to an example embodiment of the invention.

Figure 8C:
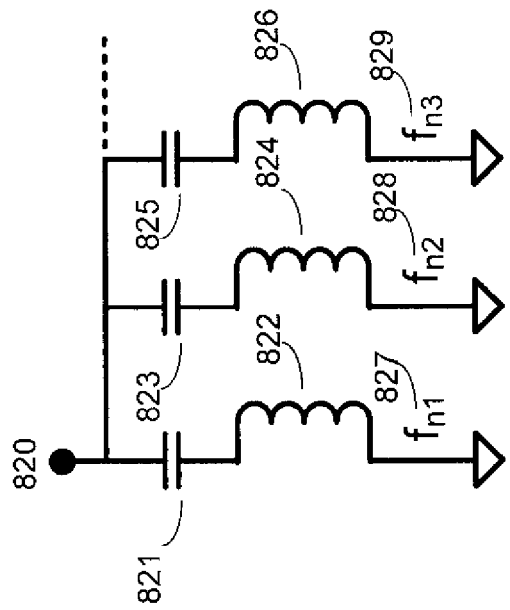
Figure 8B:
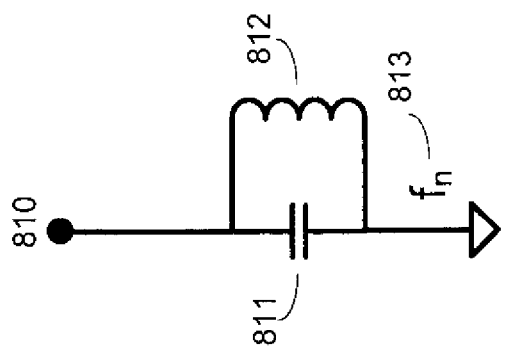
Figure 8A:
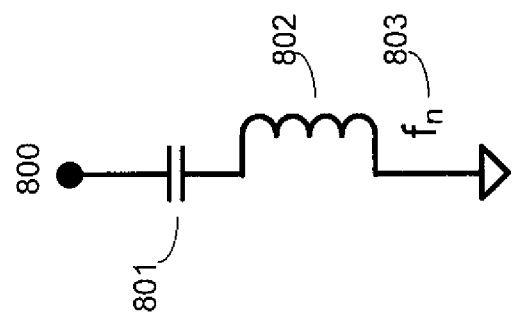

FIGS. 8A, 8B, and 8C illustrate examples of resonant circuits that may be utilized as tuning blocks for the transformers, according to example embodiments of the invention.

Figure 9:
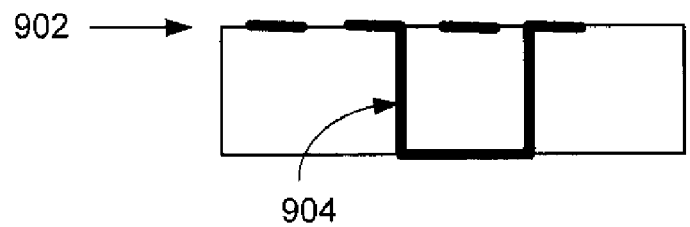

FIG. 9 illustrates an example planar substrate structure for implementing an example transformer, according to an example embodiment of the invention.

Figure 10:
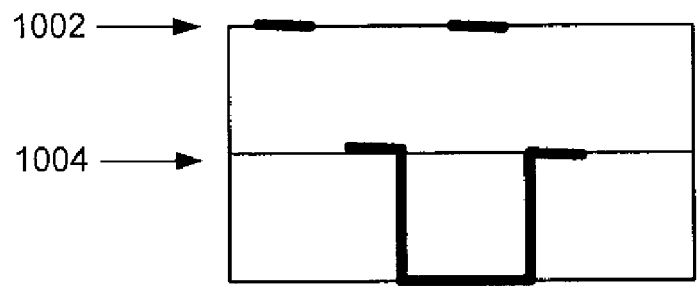
Figure 11:
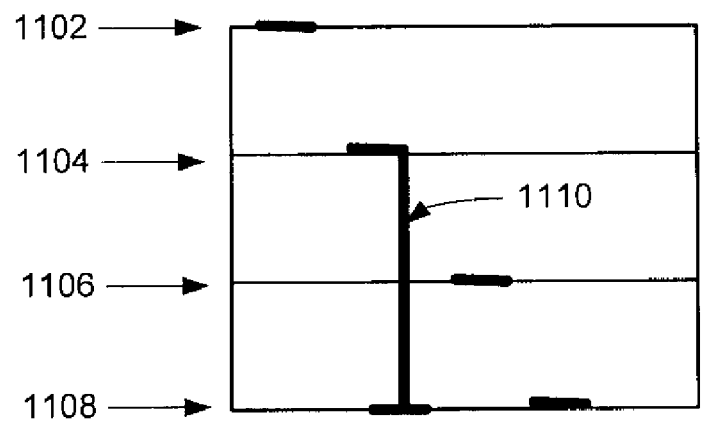

FIGS. 10 and 11 illustrate example stacked substrate structures for implementing example transformers, according to example embodiments of the invention.

Figure 12:
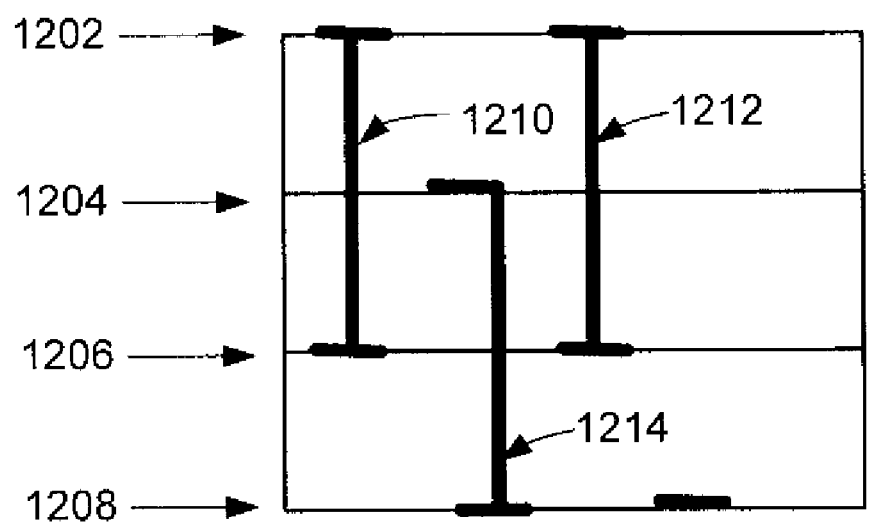

FIG. 12 illustrates an example multi-layer substrate structure for implementing an example transformer, according to an example embodiment of the invention.

DETAILED DESCRIPTION OF THE INVENTION

Embodiments of the invention now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

FIG. 1 illustrates a switching power amplifier (PA) system 100 that may include an input port 101, an optional driver amplifier stage 102, one or more switching power amplifiers 103, and an impedance transformation network 104, according to an example embodiment of the invention. According to an example embodiment of the invention, the driver amplifier stage 102 may receive an input such as a baseband signal or an RF signal from the input port 101, and may generate an output to drive the switching power amplifier 103. As shown in FIG. 1, the switching power amplifier 103 may be powered via a supply voltage port 106 (Vdd). The switching power amplifier 103 may then provide an amplified output signal to the impedance transformation network 104, which matches the output impedance of the power amplifier 103 to a load impedance at the output port 105. According to an example embodiment of the invention, the load may be a switch, a multiplexer, a filter, an antenna, or yet another type of load. According to an example embodiment of the invention, the load impedance may be 50 ohms. Where the load impedance is 50 ohms, the impedance transformation network 104 may transform the output impedance of the switching power amplifier 103 to 50 ohms, according to an example embodiment of the invention. According to an example embodiment of the invention, the impedance transformation to achieve higher output power can be accomplished by a $N_1:N_2$ transformer as the impedance transformation network 104.

FIG. 2 illustrates an example schematic diagram for a transformer in accordance with an example embodiment of the invention. As shown in FIG. 2, the transformer may include a primary winding 206 having multiple segments M each having $N_1$ turns and a single secondary winding 207 having $N_2$ turns. The multi-segment primary winding 206 may be inductively coupled to a single multi-turn secondary winding 207. According to an example embodiment of the invention, the currents induced from each segment of the multi-segment primary winding 206 may be summed in the same phase at the secondary winding 207. The secondary winding 207 may provide a system output port 208 (Vout) to which a load 209 (Rload) may be coupled. In an example embodiment of the invention, the load 209 may be a switch, a multiplexer, a filter, an antenna, or yet other loads. According to an example embodiment, the turns ratio from each segment of the multi-segment primary winding 206 to the secondary winding 207 may be $N_1:N_2$ with $N_1<N_2$ in order to boost the voltage from each segment of the multi-segment primary winding 206 to the secondary winding 207 in the ratio of substantially $N_2/N_1$.

Still referring to FIG. 2, the multi-segment primary winding 206 may be connected to one or more power amplifiers 203 (AMP 1). According to an example embodiment of the invention, the power amplifier 203 may be a differential power amplifier. The differential power amplifier AMP 1 may include one or more inputs such as differential inputs 201 (Vin 1+) and 202 (Vin 1−), wherein input 201 may be a positive signal input and input 202 may be a negative signal input. Additionally, the amplifier AMP 1 may include outputs such as outputs 204 and 205, wherein output 204 may be a positive output and output 205 may be a negative output, where outputs 204, 205 may comprise differential outputs. The outputs 204, 205 may be connected to the primary winding 206 of the transformer, according to an example embodiment of the invention.

According to an example embodiment of the invention, the current provided at the secondary winding 207 from the power amplifier 203 may be substantially $i_1=(N/M)\times i_2$, where $i_2$ is the current in the secondary winding 207, M is the number of segments within the multi-segment primary winding 206, and N is the turns ratio of each segment turn of the multi-segment primary winding 206 to the secondary winding 115 turns. Likewise, the voltage provided to the secondary winding 207 from the amplifier 203 may be may be substantially $v_1=(1/N)\times v_2$, where $v_2$ is the voltage in the secondary winding 207, and N is the turns ratio from each segment turn of the multi-segment primary winding 206 to the secondary winding 207 turns.

Still referring to FIG. 2, each segment of the multi-segment primary winding 206 may include a respective center tap port 210a-m corresponding to Vdd 1 . . . M. The center tap port 210a-m may be at virtual AC grounds when differential signals are generated by the a differential power amplifier for the multi-segment primary winding 206. The supply voltage of the differential amplifier may be fed through the center tap ports 210a-m. According to an example embodiment of the invention, the positions of the center tap ports 210a-m may correspond to a middle or symmetrical position of the respective segments of the multi-segment primary windings 206. However, in another example embodiment of the invention, the positions of the center tap ports 210a-m may vary from a middle or symmetrical position depending on the magnitudes of the differential signals generated by a differential amplifier.

FIG. 3 illustrates an example schematic diagram for a transformer in which the multi-segment primary winding may be connected to a plurality of amplifiers, according to an example embodiment of the invention. In particular, in FIG. 3, there is illustrated a primary winding 312 having M number of segments each having $N_1$ turns, and a single secondary winding 313 having $N_2$ turns. The M number of segments may be inductively coupled to the single secondary winding 313, according to an example embodiment of the invention. She outputs 310, 311 of amplifiers 307a-l (e.g., differential amplifiers) may be connected as inputs to the multi-segment primary winding 312, according to an example embodiment of the invention. Specifically, the positive signal output 310 and the corresponding negative signal output 311, which may comprise differential outputs, of the power amplifiers 307a-l may be connected as inputs to the multi-segment primary winding 312. The positive signal inputs 301a-l and the corresponding negative signal inputs 302a-l may be provided as inputs to the respective power amplifiers 307a-l. Each of the connected currents induced from each segment of the multi-segment primary winding 312 may be summed in the same phase at the secondary winding 313, according to an example embodiment of the invention. The secondary winding 313 may provide a system output port 314 (Vout) to which a load 315 (Rload) may be coupled. In an example embodiment of the invention, the load 315 may be a switch, a multiplexer, a filter, an antenna, or yet other loads. According to an example embodiment, the turns ratio from each segment of the multi-segment primary winding 312 to the secondary winding 313 may be $N_1:N_2$ with $N_1<N_2$ in order to boost the voltage from each segment of the multi-segment primary winding 312 to the secondary winding 313 in the ratio of substantially $N_2/N_1$.

Still referring to FIG. 3, each segment of the multi-segment primary winding 312 may include a respective center tap port 316a-m corresponding to Vdd 1 . . . M The center tap port 316a-m may be at virtual AC grounds when differential signals are generated by the a differential power amplifier for the multi-segment primary winding 312. The supply voltage of the differential amplifier may be fed through the center tap ports 316a-m. According to an example embodiment of the invention, the positions of the center tap ports 316a-m may correspond to a middle or symmetrical position of the respective segments of the multi-segment primary windings 312. However, in another example embodiment of the invention, the positions of the center tap ports 316a-m may vary from a middle or symmetrical position depending on the magnitudes of the differential signals generated by a differential amplifier.

FIG. 4 illustrates an example layout structure of a transformer, according to an example embodiment of the invention. As shown in FIG. 4, the transformer may include a two-segment primary winding comprising segments 407, 408, and a single two-turn secondary winding 409, according to an example embodiment of the invention. According to an example embodiment of the invention, a first end of segments 407, 408 may be connected to a common positive input port 420, and a second end of segments 407, 408 may be connected to a negative input port 421. The common input port 420 and the negative input port 421 may be fabricated as pads or other conductive connections, according to an example embodiment of the invention.

Still referring to FIG. 4, the two-segment primary winding comprising segments 407, 408 may receive inputs from a power amplifier, which may be a differential power amplifier according to an example embodiment of the invention. For example, the power amplifier may include transistors 401, 404, which may be metal oxide semiconductor field-effect transistors (MOSFETs) that each include respective sources, gates, and drains. In FIG. 4, both the sources of transistors 402, 403 may be grounded. The gate of transistor 402 may be connected to a positive signal input 401 (Vin 1+) while the gate of transistor 403 may be connected to a negative signal input 404 (Vin 1−). Likewise, the drain of transistor 402 may provide the differential amplifier's positive output 405, which may be connected to a common positive input port 420 that provides a first input to both the first and second segments 407, 408. Similarly, the drain of transistor 403 may provide the differential amplifier's negative output 406, which may be connected to a common negative input port 421 that provides a second input to both the first and second segments 407, 408. It will be appreciated that while the transistors 402, 403 may be illustrated as MOSFETs in some embodiments, the transistors 402, 403 may also be Bipolar Junction Transistors (BJTs) or yet other types of transistors as well.

According to an example embodiment of the invention, magnetically induced currents by excitation of two segments 407, 408 of the primary winding may be added together at the secondary winding 409 in the same phase. According to an example embodiment of the invention, the transformer may be designed or configured such that the currents of primary segments 407, 408 are in the same direction to prevent self-cancellation, according to an example embodiment of the invention. A load may be connected to the output ports 410, 411 of the secondary winding 409, according to an example embodiment of the invention. According to an embodiment of the invention, the turns for the segments of the primary winding and the secondary winding may be routed over overlapping portions using one or more via connections.

FIG. 5 illustrates an example schematic diagram for a transformer utilizing one or more tuning blocks, according to an example embodiment of the invention. The tuning blocks may be operative to adjust or alter an operational parameter of the transformer, according to an example embodiment of the invention. As shown in FIG. 5, the transformer may include a primary winding 506 having two segments each having $N_1$ turns and a single secondary winding 507 having $N_2$ turns. The multi-segment primary winding 506 may be inductively coupled to a single multi-turn secondary winding 507. According to an example embodiment of the invention, the currents induced from each segment of the multi-segment primary winding 506 may be summed in the same phase at the secondary winding 507. The secondary winding 507 may provide a system output port 508 (Vout) to which a load 509 (Rload) may be coupled. In an example embodiment of the invention, the load 509 may be a switch, a multiplexer, a filter, an antenna, or yet other loads. According to an example embodiment, the turns ratio from each segment of the multi-segment primary winding 506 to the secondary winding 507 may be $N_1:N_2$ with $N_1<N_2$ in order to boost the voltage from each segment of the multi-segment primary winding 206 to the secondary winding 207 in the ratio of substantially $N_2/N_1$.

Still referring to FIG. 5, the multi-segment primary winding 506 may be connected to one or more power amplifiers 503 (AMP 1). According to an example embodiment of the invention, the power amplifier 503 may be a differential power amplifier. The differential power amplifier AMP 1 may include one or more inputs such as differential inputs 501 (Vin 1+) and 502 (Vin 1−), wherein input 501 may be a positive signal input and input 502 may be a negative signal input. Additionally, the amplifier AMP 1 may include outputs such as differential outputs 504 and 505, wherein output 504 may be a positive output and output 505 may be a negative output. The outputs 504, 505 may be connected to the primary winding 506 of the transformer, according to an example embodiment of the invention.

Still referring to FIG. 5, the use of a differential amplifier may result in each segment of the multi-segment primary winding 506 having a respective center tap port 510, 511. The center tap port 510, 511 may be at virtual AC grounds when differential signals are generated by the a differential power amplifier for the multi-segment primary winding 506. The supply voltage of the differential amplifier may be fed through the center tap ports 510, 511. According to an example embodiment of the invention, a first tuning block 512 may be provided at center tap port 510 for the first segment of the multi-segment primary winding 506. Likewise, a second tuning block 513 may be provided at a center tap port 513 for the second segment of the multi-segment primary winding 506. The tuning blocks 512, 513 may be operative to control, adjust, filter, or otherwise tune the frequency bands of coupling, according to an example embodiment of the invention. For example, the tuning blocks 512, 513 may be resonant circuits that are operative to selectively enhance or suppress one or more frequency components, according to an example embodiment of the invention.

FIG. 6 illustrates an example layout structure for an example transformer utilizing one or more tuning blocks, according to an example embodiment of the invention. The transformer may include a plurality of segments of the multi-segment primary winding that are inductively coupled to a secondary winding, according to an example embodiment of the invention. As shown in FIG. 6, there may be two primary segments 607, 608 (of a multi-segment primary winding) each having a single turn ($N_1=1$), and a secondary winding 609 having two turns ($N_2=2$). Both of the segments 607, 608 may be connected to one or more amplifiers 603 (AMP 1) through a common positive input port 620 and a common negative input port 621. In particular, the amplifier may receive a positive input signal 601 (Vin 1+) and a negative input signal 602 (Vin 1−) and provide a positive output 604 and a negative output 605 to the respective common positive input port 620 and common negative input port 621.

According to an example embodiment of the invention, the power amplifier 603 may be a differential amplifier. According to an example embodiment of the invention, the generation of differential outputs 604, 605 by a differential amplifier may result in an AC virtual ground being present at center tap ports 612, 613 in the respective first and second segments 607, 608. According to an example embodiment of the invention, the supply voltage of the differential amplifier may be provided through the center tap ports 612, 613. According to an example embodiment of the invention, a first tuning block 614 may be connected to the first center tap port 612, while a second tuning block 615 may be connected to the second center tap port 613. It will be appreciated that the first and second tuning blocks 614, 615 may be fabricated as party of the same substrate(s) as the transformer structure or as discrete modules that are in communication with the transformer layout structure, according to an example embodiment of the invention. Further, the tuning blocks 614, 615 may be resonant circuits that are operative to selectively enhance or suppress one or more frequency components, according to an example embodiment of the invention.

FIG. 7 illustrates an example layout structure of a transformer of an example power amplifier system with an auxiliary winding adjacent to or substantially encapsulating a portion of the transformer, according to an example embodiment of the invention. In particular, FIG. 7 illustrates the example layout structure for a transformer of FIG. 6 with an additional auxiliary winding 702. According to an example embodiment of the invention, the auxiliary winding 702 may be coupled to a transformer to sense an amount of coupling between the primary segments 607, 608 and the secondary winding 609. It will be appreciated that while the auxiliary winding 702 illustrated in FIG. 7 may be varied according to example embodiments of the invention. For example, an auxiliary winding for power sensing may be placed adjacent to one side of a transformer to sense an amount of coupling. According to another example, an auxiliary winding for power sensing may be placed adjacent to one side or a plurality of sides of a transformer to sense an amount of coupling. Furthermore, while an auxiliary winding has been illustrated with respect to an example transformer of FIG. 7, the auxiliary winding is likewise application to other transformers, including others described herein, according to example embodiments of the invention.

The tuning blocks illustrated in FIGS. 5-7 may be implemented in a variety of ways in accordance with example embodiments of the invention. According to an example embodiment of the invention, the tuning blocks may comprise resonant circuits. FIGS. 8A, 8B, and 8C illustrate some examples of resonant circuits that may be utilized as tuning blocks for the transformers, according to an example embodiment of the invention.

FIG. 8A is a schematic diagram of an example tuning block, according to an example embodiment of the invention. As shown in FIG. 8A, the tuning block may be a resonant circuit comprised of a capacitive component 801 and an inductive component 802 connected in series, according to an example embodiment of the invention. The port 800 of the resonant circuit may be connected to a center tap port of a segment of a primary winding, according to an example embodiment of the invention. The resonant circuit of FIG. 8A may have an associated resonant frequency fn 803, according to an example embodiment of the invention.

FIG. 8B illustrates another schematic diagram of an example tuning block, according to an example embodiment of the invention. As shown in FIG. 8B, the tuning block may be a resonant circuit comprised of a capacitive component 811 in parallel with an inductive component 812. The port 810 of the resonant circuit may be connected to a center tap port of a segment of primary winding, according to an example embodiment of the invention. The resonant circuit may have a resonant frequency in 813, according to an example embodiment of the invention.

FIG. 8C illustrates another schematic diagram of an example tuning block, according to an example embodiment of the invention. As shown in FIG. 8C, there may be a resonant circuit having a plurality of resonant frequencies such as resonant frequencies fn1 827, fn2 828, and fn3 829. For example, capacitive component 821 and inductive component 822 may be connected in series to provide resonant frequency fn1 827. Likewise, capacitive component 823 may be connected in series to inductive component 824 to provide resonant frequency fn2 828. Additionally, capacitive component 825 may be connected in series with inductive component 826 to provide resonant frequency fn3 829. The port 820 of the resonant circuit may be connected to a center tap port of a segment of a primary winding, according to an example embodiment of the invention. It will be appreciated that while FIG. 8C illustrates a particular configuration for a resonant circuit, other embodiments of the invention may include varying types of series/parallel resonant circuits without departing from example embodiments of the invention. Furthermore, while the tuning blocks are illustrated as being connected at the center tap ports, other embodiments of the invention may connect the tuning blocks to the primary windings in other locations as well.

It will be appreciated that the values and parameters of the capacitive and inductive components of FIGS. 8A-8C may be selected to have one or more desired resonant frequencies. According to an example embodiment of the invention, the one or more resonant frequencies of the tuning block may be operative to filter undesirable harmonics or enhance other harmonics at the one or more resonant frequencies, thereby controlling the frequencies of coupling.

According to an example embodiment of the invention, the layouts for the transformers described herein may be implemented utilizing a planar structure, stacked structure, or a multi-layer structure. With a planar structure, all of the segments of the primary windings may be placed substantially in the same metal layer. A secondary winding with multiple turns may be placed between one segment of the primary winding and another segment of the primary winding such that one segment of the primary winding is directly adjacent to another segment of the primary winding. For example, as shown in the example planar substrate structure of FIG. 9, a first segment of a primary winding may be fabricated entirely on first metal layer 902 while a second segment of the primary winding may also be fabricated substantially on the same first metal layer 902. Likewise, a multi-turn secondary winding may also be fabricated substantially on the surface layer between segments of the primary windings. According to an example embodiment of the invention, cross-over sections for the primary segments or secondary winding may be routed using one or more via connections 904.

According to another example embodiment of the invention, the layouts for the transformers may also be implemented utilizing a stacked structure. With an example stacked structure, all of segments of the primary winding may be placed in parallel and neighbor each other on one metal layer, and the secondary winding may be placed in another metal layer. For example, in the stacked substrate structure of FIG. 10, the segments of the primary windings may be formed on metal layer 1002 while the secondary winding may be formed on metal layer 1004, according to an example embodiment of the invention.

According to another example embodiment of the invention, the transformer may be implemented in another stacked structure, where each segment of the multi-segment primary winding may be placed in parallel in each different layer, but the layers of the primary windings may not be vertically neighboring each other, where the secondary winding with multiple turns may be placed between one metal layer of a segment of the primary winding and another metal layer of another segment of the primary winding, where the multiple turns of the secondary winding may occupy multiple layers connected with vias. For example, in the example stacked substrate structure of FIG. 11, a first segment of the primary winding may be formed on metal layer 1102 while a second segment of the primary winding may be formed on another metal layer 1106. The single secondary winding having multiple turns may be formed using a combination of metal layers 1104 and 1108 and connected by at least one via 1110, according to an example embodiment of the invention. Additionally, while not illustrated in FIG. 11, each segment of the primary winding may similarly be connected to a common positive input port and a common negative input port using one or more vias.

According to another example embodiment of the invention, the transformer may be implemented in a multi-layer structure. With the multi-layer structure, each segment of the primary winding may be fabricated on two or more metal layers and connected by vias. Likewise, the secondary winding may be fabricated using two or more layers and connected by vias. For example, as shown in FIG. 12, a first segment of the primary winding may be fabricated on a first part of the first metal layer 1202 and a first part of the third metal layer 1206 and connected by at least one first via 1210. Similarly, a second segment of the primary winding may be fabricated on a second part of the first metal layer 1202 and a second part of the third metal layer 1206 and connected by at least one second via 1212. According to an example embodiment of the invention, the single secondary winding may be fabricated on the second metal layer 1204 and the fourth metal layer 1208 and connected by at least one third via 1214.

In accordance with an embodiment of the invention, the core of the power amplifiers and the transformer windings may be spatially separated from each other to reduce the magnetic coupling from the transformer to the core of the power amplifiers and thereby reduce the possibility of instability. In accordance with another embodiment of the invention, the spatially separated transformer from the core of the power amplifiers may be implemented on a separate substrate provided by a different technology. Accordingly, the transformer and the power amplifiers need not be limited to a single fabrication technology. According to still another embodiment of the invention, the spatially interweaved transformer may be compact in size. Many other variations of the transformers and power amplifiers are available without departing from embodiments of the invention.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A power amplifier system comprising:
   a power amplifier that generates a first differential output signal and a second differential output signal;
   a primary winding comprised of a plurality of primary segments, wherein a first end of each primary segment is connected to a first common input port and a second end of each primary segment is connected to a second common input port, wherein the first common input port is operative to receive the first differential output signal, and wherein the second common input port is operative to receive the second differential output signal; and
   a single secondary winding inductively coupled to the plurality of primary segments.

2. The system of claim 1, wherein each primary segment of the primary winding includes a first number of turns, and wherein the single secondary winding includes a second number of turns greater than the first number of turns.

3. The system of claim 1, wherein each primary segment of the primary winding includes a center-tap port, and further comprising;
   at least one tuning block connected to the center-tap port for each primary segment.

4. The system of claim 3, wherein the at least one tuning block includes one or more resonant circuits.

5. The system of claim 4, wherein the one or more resonant circuits includes one or more capacitive components and one or more inductive components.

6. The system of claim 4, wherein the at least one tuning block utilizes the resonant circuits to selectively enhance or suppress one or more frequency components.

7. The system of claim 4, wherein the primary segments of the primary winding are arranged relative to the single secondary winding such that flux or currents induced by the primary segments in the secondary winding are summed in phase.

8. The system of claim 1, wherein the single secondary winding is positioned between primary segments having a same current flow direction, and wherein the primary segments and the single secondary winding are fabricated using (i) a planar structure, (ii) a stacked structure, or (iii) multi-layer structure.

9. The system of claim 8, wherein the planar structure includes a metal layer, wherein the primary segments are fabricated on the metal layer as substantially parallel primary segments, and wherein the secondary winding is fabricated on the metal layer such that the secondary winding positioned between adjacent primary segments.

10. The system of claim 8, wherein the stacked structure includes a first metal layer and a second metal layer opposite the first metal layer, wherein the primary segments are fabricated on the first metal layer, and the single secondary winding is fabricated on the second metal layer.

11. The system of claim 8, wherein the stacked structure includes a first metal layer, a second metal layer, a third metal layer, and a fourth metal layer, wherein the third metal layer is positioned between the first and second metal layers, and wherein the second metal layer is positioned between the third and fourth metal layers, and wherein a first segment of the primary segments is fabricated on the first metal layer, a second segment of the primary segments is fabricated on the second metal layer, and the single secondary winding is fabricated on a combination of the third metal layer and the fourth metal layer, wherein the third metal layer and the fourth metal layer are connected by at least one via.

12. The system of claim 8, wherein the multi-layer structure includes a first metal layer, a second metal layer, a third metal layer, and a fourth metal layer, wherein the third metal layer is positioned between the first and second metal layers, wherein the second metal layer is positioned between the third and fourth metal layers, wherein a first segment of the primary segments is fabricated on a first part of the first metal layer and a first part of the second metal layer, wherein the first part of the first metal layer and the first part of the second metal layer are connected by at least one first via, wherein a second segment of the primary segments is fabricated on a second part of the first metal layer and a second part of the second metal layer, wherein the second part of the first metal layer and the second part of the second metal layer are connected by at least one second via, and wherein the single secondary winding is fabricated on the third metal layer and the fourth metal layer, wherein the third metal layer and the fourth metal layer are connected by at least one third via.

13. The system of claim 1, wherein the primary winding and the single secondary winding form a transformer, and further comprising an auxiliary winding that is adjacent to one or more sides of the transformer to sense and amount of coupling between the primary segments of the primary winding and the single secondary winding.

14. A method for providing a power amplifier system, comprising:
provided a power amplifier that generates a first differential output signal and a second differential output signal;
receiving the first differential output signal at a first common input port and the second differential output signal at a second common input port, wherein the first common input port is connected to a first end of a plurality of primary segments that form a primary winding, and wherein the second common input port is connected to a second end of the plurality of primary segments; and
inductively coupling the plurality of primary segments to a single secondary winding.

15. The method of claim 14, wherein each primary segment of the primary winding includes a center-tap port, and further comprising:
connecting at least one tuning block to a center-tap port for each primary segment.

16. The method of claim 15, wherein connecting at least one tuning block includes connecting at least one tuning block that includes one or more resonant circuits.

17. The method of claim 16, wherein the at least one tuning block utilizes the resonant circuits to selectively enhance or suppress one or more frequency components.

18. The method of claim 14, wherein the single secondary winding is positioned between primary segments having a same current flow direction, and wherein the primary segments and the single secondary winding are fabricated using (i) a planar structure, (ii) a stacked structure, or (iii) multi-layer structure.

19. The method of claim 18, wherein the planar structure includes a metal layer, and further comprising fabricating the primary segments on the metal layer as substantially parallel primary segments, and fabricating the secondary winding on the metal layer such that the secondary winding is positioned between adjacent primary segments.

20. The method of claim 18, wherein the stacked structure includes a first metal layer and a second metal layer opposite the first metal layer, and further comprising fabricating the primary segments on the first metal layer, and fabricating the single secondary winding on the second metal layer.

21. The method of claim 18, wherein the stacked structure includes a first metal layer, a second metal layer, a third metal layer, and a fourth metal layer, wherein the third metal layer is positioned between the first and second metal layers, wherein the second metal layer is positioned between the third and fourth metal layers, and further comprising:
fabricating the first segment of the primary segments on the first metal layer;
fabricating a second segment of the primary segments on the second metal layer; and
fabricating the single secondary winding on a combination of the third metal layer and the fourth metal layer, wherein the third metal layer and the fourth metal layer are connected by at least one via.

22. The method of claim 18, wherein the multi-layer structure includes a first metal layer, a second metal layer, a third metal layer, and a fourth metal layer, wherein the third metal layer is positioned between the first and second metal layers, wherein the second metal layer is positioned between the third and fourth metal layers, and further comprising:
fabricating a first segment of the primary segments on a first part of the first metal layer and a first part of the second metal layer, wherein the first part of the first metal layer and the first part of the second metal layer are connected by at least one first via;
fabricating a second segment of the primary segments on a second part of the first metal layer and a second part of the second metal layer, wherein the second part of the first metal layer and the second part of the second metal layer are connected by at least one second via; and
fabricating the single secondary winding on the third metal layer and the fourth metal layer, wherein the third metal layer and the fourth metal layer are connected by at least one third via.

23. The method of claim 14, wherein the primary winding and the single secondary winding form a transformer, and further comprising:
positioning an auxiliary winding adjacent to one or more sides of the transformer to sense and amount of coupling between the primary segments of the primary winding and the single secondary winding.

* * * * *